United States Patent [19]

Auda

[11] Patent Number: 5,578,161

[45] Date of Patent: Nov. 26, 1996

[54] METHOD AND APPARATUS FOR IN-SITU AND ON-LINE MONITORING OF TRENCH FORMATION PROCESS

[75] Inventor: Bernard Auda, Montlhery, France

[73] Assignee: International Business Machines Corporation, Armonk, N.Y.

[21] Appl. No.: 869,575

[22] Filed: Apr. 15, 1992

[30] Foreign Application Priority Data

Apr. 30, 1991 [EP] European Pat. Off. ............ 91480070

[51] Int. Cl.$^6$ ................................................ H01L 21/302
[52] U.S. Cl. ................... 156/626.1; 156/627.1; 156/645.1; 156/643.1
[58] Field of Search ................ 156/626.1, 627, 156/645, 643; 118/723

[56] References Cited

U.S. PATENT DOCUMENTS

| | | | |
|---|---|---|---|
| 4,479,848 | 10/1984 | Otsuka et al. | 156/626 |
| 4,615,761 | 10/1986 | Tada et al. | 156/626 |
| 4,687,539 | 8/1987 | Burns et al. | 156/626 |
| 4,877,479 | 10/1989 | McNeil et al. | 156/626 |
| 4,936,967 | 6/1990 | Ikihara et al. | 156/626 |
| 4,998,021 | 3/1991 | Mimasaka | 156/626 |
| 5,002,631 | 3/1991 | Giapis et al. | 156/626 |
| 5,023,188 | 6/1991 | Tanaka | 156/626 |
| 5,030,316 | 7/1991 | Motoyama et al. | 156/626 |

FOREIGN PATENT DOCUMENTS

| 394597 | 10/1990 | European Pat. Off. | H01L 21/306 |
|---|---|---|---|
| 0230323 | 10/1986 | Japan | 156/626 |

OTHER PUBLICATIONS

K. J. Cooper et al., "Physical and Electrical Characteristics of Submicron Trench Capacitors," 1046b Extended Abstracts, Fall Mtg., Seattle, WA, Oct. 14, 1990, pp. 410–411.

Patent Abstracts of Japan, vol. 10, No. 117 (E–400), May 02, 1986, (JP–A–60 253228, Dec. 13, 1985).

Patent Abstracts of Japan, vol. 8, No. 127 (E–250), Jun. 14, 1984, (JP–A–59 040534, Mar. 6, 1984).

Primary Examiner—Asok Pal
Attorney, Agent, or Firm—Eugene I. Shkurko; Lawrence H. Meier

[57] ABSTRACT

An apparatus (20) for monitoring the trench formation process in a silicon wafer on a full in-situ and on-line basis. The apparatus includes two spectrometers (30A, 30B) for viewing the plasma used in the trench etching process at zero and normal angles of incidence with respect to the plane of the wafer, respectively. Both spectrometers are tuned to detect the radiation associated with a selected specie present in the plasma. Based on information contained in the output signals of the spectrometers, the depth D of the trench and the thickness Th and rate of deposition of the redeposited $SiO_2$ layer are computed in real time. When the computed depth D matches a final depth of parameter, the trench formation process is terminated.

15 Claims, 3 Drawing Sheets

METHOD AND APPARATUS FOR IN-SITU AND ON-LINE MONITORING OF TRENCH FORMATION PROCESS

FIELD OF THE INVENTION

The present invention relates to integrated circuits incorporating trench structures and more particularly to a method for in-situ and on-line monitoring of the trench formation process by dry etching techniques. The present invention also concerns the apparatus for monitoring said trench formation process.

Fabrication of trenches etched in the semiconductor substrate of an integrated circuit which, regardless of their length, have an aspect ratio (depth to width ratio) greater than 1 is desirable in several areas of VLSI processing. In particular, groove-shaped trenches are extensively used as an isolation technique between devices in the semiconductor substrate. Another particular area where trench formation is a critical need is in Dynamic Random Access Memories (DRAMs), where each individual memory cell essentially consists of a MOS transistor/capacitor combination. Higher packing densities may be achieved for MOS DRAMs if the cell area consumed by the standard planar storage capacitor can be decreased. This is achieved by placing the capacitor dielectric on the sidewalls of a hole etched sufficiently deep in the semiconductor substrate to have the equivalent surface area of the planar capacitor. This hole is also commonly referred to as a trench in the literature. Note that trenches in such applications tend to be deeper than those required for isolation purposes, and moreover, have their own specific requirements.

A state of the art trench formation process in the manufacturing of MOS DRAM cells with trench capacitors is given hereafter in conjunction with FIGS. 1 to 5, which are cross-sectional views of a semiconductor structure at different steps of the process. As shown in FIG. 1, there is illustrated a portion of a conventional semiconductor structure 10, comprising a silicon (Si) substrate 11 coated with a composite insulating trench hard mask 12. Said mask 12 typically consists of an underlying or bottom 25 nm thick silicon dioxide ($SiO_2$) layer 13, an intermediate 55 nm thick silicon nitride ($Si_3N_4$) layer 14 and a top 300 nm pyrolitic silicon dioxide ($SiO_2$) layer 15. The latter is preferably deposited by a Chemical Vapor Deposition (CVD) technique. A layer 16 of a photoresist material, e.g. AZ1350J supplied by Hoechst, Wiesbaden, Germany, is formed on top of the structure with a thickness of about 800 nm. Semiconductor structure 10 must be understood as a part of a wafer to be processed that includes a great number of chips.

The photoresist layer 16 is exposed through a lithographic mask to UV light, then developed as standard to produce a photoresist mask with the desired pattern of openings. In turn, this pattern of openings is used as an in-situ mask for etching the underlying trench mask 12 by dry etching. Current VLSI dry etching processes are achieved either by high pressure planar plasma etching or by low pressure reactive ion etching. The etch process is typically dependent upon the generation of reactive species (atoms, radicals, ions) from a gas which are absorbed by the surface to be etched. A chemical reaction takes place between the surface and these species and the gaseous reaction product is then removed from the surface. Typically, a Magnetically Enhanced Reactive Ion Etching (MERIE) plasma etching system such as the AME precision 5000, supplied by Applied Materials Inc, Santa Clara, Calif., USA, is appropriately used to etch the hard mask 12 through the photoresist mask 16. Different compositions of gas mixtures, e.g. $CHF_3+O_2$, may be used. Next, the remaining photoresist layer 16 is removed as standard, for example by ashing in $O_2$ in the same AME 5000 equipment. At the end of this step, the resulting structure with only one opening referenced 17 in the trench mask 12, is shown in FIG. 2. Opening 17 may be a hole as standard but is not limited to that particular circular shape. For the sake of illustration, assuming opening 17 is circular, its diameter or width at the substrate surface is Ws.

Next, the silicon substrate 11 is etched for trench formation using the trench mask 12 as an in-situ mask. Basically, this is accomplished by a relatively complex process which employs a chemistry that causes continuous $SiO_2$ redeposition as long as the trench is being etched. For instance, a $HBr+NF_3+SiF_4+He+O_2$ gas mixture is appropriate because this composition produces fluorine radicals (F) which etch silicon, and bromine radicals (Br) which combine with the etched silicon to form silicon bromide radicals (SiBr), which in turn, react with the oxygen ($O_2$) to produce said $SiO_2$ redeposition. Typical gas flows read as follows: HBr(45 sccm), $NF_3$(7 sccm), $SiF_4$(5 sccm) and $He+O_2$(13 sccm). A simplified description of such a conventional trench formation process will be now given.

In a preliminary cleaning step, a HBr+NF3 gas is used to remove any native oxide particulates that could have been produced on the exposed silicon surface during the former steps. Particulates, and more generally any contamination, cause micro-masking effects that would be detrimental to the DRAM product reliability. The trench mask 12 remaining thickness is around 300 nm after this preliminary step.

In the next step, the $HBr+NF_3+SiF_4+He+O_2$ gas composition and the plasma etching system mentioned above are used to selectively etch silicon with the strong anisotropy that is desired. The following parameters are appropriate to carry out the etching step: Power=700 W, Freq.=13.56 MHz, magnetic field B=55 G and Pressure=13.3 Pa. As the silicon is etched, successive layers of thin pyrolitic silicon dioxide, assumed stochiometric ($SiO_2$), are redeposited onto the structure. $SiO_2$ redeposition insures adequate slope formation and trench side-wall smoothness. This is apparent from FIG. 3, which illustrates the trench formation process at an intermediate stage. In FIG. 3, the $SiO_2$ redeposited layer referenced 18 has a thickness represented by Th and the trench is referenced by numeral 19. At this stage of the process, the important trench related parameters are the depth D, the thickness Th of the $SiO_2$ redeposited layer, and taper angle θ.

At the end of the trench formation process, the resulting structure is shown in FIG. 4. The final $SiO_2$ redeposited layer and the trench are respectively referenced 18f and 19f. The total thickness Thf of layer 18f is around 150 nm and the total duration of the etching process is about 10 min. The total thickness of the remaining insulating layers above substrate 11 is about 450 nm.

Finally, FIG. 5 shows the particular profile of the trench 19f that is finally obtained once all the pyrolitic $SiO_2$ layers 15 and 18f mentioned above have been removed from the structure. At the top surface of the silicon substrate 11 and at the bottom thereof, the trench widths are respectively Ws and Wb. The final trench depth in the silicon substrate 11 represented by Df and the final taper angle θf of the trench 19f, characterize the final profile of the trench.

Th(Thf), θ(θf) and D (Df) are the key parameters of the trench formation process. There is no doubt that the physical characteristics of the trench must be very carefully controlled to achieve satisfactory results in most applications. This is more particularly true in the DRAM technology where the trench cross-sectional profile illustrated by taper angle θf is of particular concern in all respects. The sidewalls of the trench must be substantially vertical, i.e. forming an angle of about 2 degrees from the vertical. In addition, the interior surface of the trench must be smooth, i.e. without any asperity to ensure the integrity of the very thin $SiO_2$ layer to be subsequently deposited that will form the capacitor dielectric.

Therefore, what is the aim of all DRAM manufacturers, is to monitor such a process for forming trenches having smooth sidewalls and rounded bottom with a controlled slope and depth. In particular, the trench related parameters must have a predetermined and very accurate value, typically, θf=2 degrees (plus or minus 1 degree), and Df=7.5 microns (plus or minus 1 micron).

To date, the $SiO_2$ redeposition step is continuously followed by ellipsometry to measure the increase in the thickness Th of layer 18 because there is a relatively good correlation between the thickness evolution, (which depends on the etching duration or time t) and the taper angle θ. Unfortunately, the correlation is relatively poor with respect to the corresponding depth D. For example, trenches may have different final depths Df with the same final taper angle θf. This is why, after the termination of the trench formation process steps, a sample wafer at the stage of the structure of FIG. 5, is sliced to provide a cross-section which, through SEM analysis, permits the exact determination of final depth Df and taper angle θf. Should these values be out of specifications, the whole lot of wafers would be rejected.

In summary, such a trench formation process is conventionally monitored by time through inaccurate ellipsometry based techniques which may require several iterative operations until the desired trench depth is reached. At the end of each of the said operations, SEM cross-section analysis are used to determine the real value of trench parameters: taper angle and depth. Therefore, to date, the state of the art monitoring methods are typically based on ex-situ and off-line techniques. In addition, the known methods are expensive (the cost is one wafer per lot at each of said operations) and also time consuming because of the idle process time while waiting for the SEM cross-section analysis conclusions. As a result, the known monitoring methods of the trench formation process present several distinctive difficulties, at which the present invention is aimed to overcome.

SUMMARY OF THE INVENTION

Therefore, it is a primary object of the present invention to provide an in-situ and on-line monitoring method of a trench formation process in a semiconductor substrate by dry etching.

It is another object of the present invention to provide an in-situ and on-line monitoring method of a trench formation process in a semiconductor substrate by dry etching that has either manual or automatic efficient etch end-point detection capabilities.

It is another object of the present invention to provide an in-situ and on-line monitoring method of a trench formation process in a semiconductor substrate by dry etching that is different from the conventional monitoring methods based on ellipsometry techniques and SEM cross-section analysis that are costly and time consuming.

It is still another object of the present invention to provide an apparatus to implement said in-situ and on-line monitoring method of a trench formation process in a semiconductor substrate by dry etching.

According to the present invention, the overall etching system includes a dry etching device in which the etch chamber is provided with (a) side and top quartz windows and (b) a monitoring apparatus. According to the present invention said apparatus basically includes two spectrometers connected to these side and top windows by two optical fibers so that the optical fibers "look" at the plasma at zero and normal angles of incidence with respect to the wafer plane, respectively. The spectrometers are tuned to look at the same species radiation, e.g. one SiBr band. Signals outputted by the spectrometers viewing the side and top windows are different:

side signal Il as a function of time t is representative of the band intensity variation during the trench etching;

top signal It as a function of time t is representative of both the band intensity variation and the wafer surface reflectivity. Thus, signal It is a mixed signal with an interferometric component Ii.

The apparatus further includes means for converting said analog signals Il and It into digital values, digital processing and decision means for processing said values and terminating the etching process when appropriate, and optionally plotting means for signal display.

According to the monitoring method of the present invention, the said interferometric component signal Ii is extracted by subtracting the side from the top signal. The interferometric signal Ii is of the quasi-periodic damped type. Then, the envelope signals Ja and Jb of said interferometric signal Ii, and finally, the amplitude variation signal I of the said envelope signals are generated.

The trench depth D is determined in real time by equation:

$$D = k \sqrt{I(t=0) - I}$$

wherein k is a coefficient proper to the etching system and is determined by a preliminary calibration step thereof.

The thickness Th of the redeposited $SiO_2$ layer is computed in real time by the equation:

$$Th = \left( \frac{\lambda}{4ntu} \right) \cdot t$$

wherein λ is the wavelength of the selected species (e.g. SiBr), n is the refractive index of the redeposited $SiO_2$ layer, and tu is the half-period of the interferometric signal Ii.

D and Th are continuously monitored until the desired final parameters Df and Thf expressed in the specifications are obtained. This, in turn, ensures the desired value of θf is also obtained.

The trench formation process is therefore fully and automatically controlled by the in-situ and on-line monitoring method of the present invention.

BRIEF DESCRIPTION OF THE DRAWINGS

The novel features believed to be characteristic of this invention are set forth in the appended claims. The invention itself, however, as well as other objects and advantages thereof, may best be understood by reference to the following detailed description of illustrated preferred embodiments, read in conjunction with the accompanying drawings in which:

DETAILED DESCRIPTION OF THE INVENTION

The present invention relates to integrated circuits incorporating trench structures and more particularly to a method for in-situ and on-line monitoring of the trench formation process by dry etching techniques, particularly useful for the etch end-point detection. The present invention also concerns the apparatus for monitoring said trench formation process.

Figure 6:
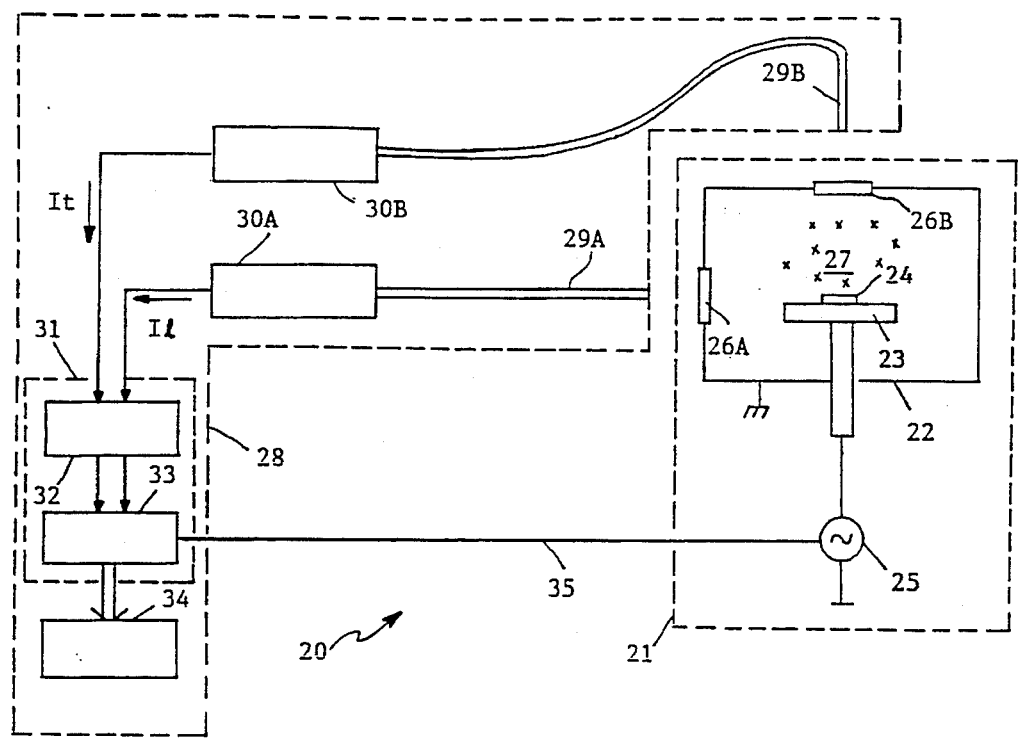
FIG. 6 is a schematic illustration of the apparatus of the present invention including top and side spectrometers for monitoring the trench formation process illustrated in conjunction with FIGS. 1 to 5.

Now turning to FIG. 6, which shows the etching and monitoring system 20 of the present invention. System 20 first comprises a dry etching equipment 21 which essentially consists of: an etch-treatment chamber 22 enclosing a planar-shaped susceptor 23 that holds the article 24 to be processed, typically a silicon wafer, and a RF power supply source 25. According to the teachings of the present invention, it is essential the etch-treatment chamber 22 be provided with two quartz windows 26A and 26B respectively located at the lateral (or side) wall and at the top of it. An appropriate equipment is the AME precision 5000 mentioned above, which includes a plurality of single wafer plasma etch reactors. With this type of equipment, susceptor 23 is the cathode and the chamber wall is the other electrode connected to ground. The plasma 27 generated between the two electrodes contains species that are representative of the etching conditions. While etching is performed, the emission from these species changes in intensity as a function of time, material etched and surface modifications.

System 20 further comprises the monitoring apparatus 28 of the present invention. Still according to the present invention, two fiber optic probes 29A and 29B are respectively connected to quartz windows 26A and 26B for short distance transmission of the radiation emitted by the different species that are produced in the chamber 22 during the etching process. Each optic fiber probe must provide a solid angle that allows capture of the light from a relatively large area of the plasma 27. It is highly desirable to have the lateral or side optic fiber probe 29A focussing plasma 27 in the close vicinity of the wafer surface and at a zero angle of incidence with respect to the wafer plane. On the other hand, it is essential that optic fiber probe 29B views the wafer through the plasma at a substantially normal angle of incidence. Optic fiber probes 29A and 29B are respectively connected to spectrometers 30A and 30B. An adequate spectrometer is model SD20 available from the Sofie Inst, Arpajon, France. This model of spectrometer is tunable over a wide-range radiation spectrum and, in the present case, is tuned on the wavelength of one particular SiBr band, as described hereinafter. Each spectrometer comprises a monochromator and a detector (not detailed). The transmitted radiation is received by the motor-driven monochromator which filters out all radiation wavelengths except the one selected radiation to be monitored. The selected radiation is then received by the detector. The detector may be either a low-noise diode detector or preferably a low-noise photomultiplier tube combined with an amplifier. Analog output signals Il and It supplied by the amplifying sections of the side and top spectrometers 30A and 30B respectively, are applied to a processing unit 31, which in a preferred embodiment comprises an A/D converter 32 and a software operated computer 33. A plotter (or a chart recorder unit) 34 (and/or a visual display) is connected to computer 33. Plotter 34 allows the plotting of analog signals that are generated according to the present monitoring method. Computer 33 receives the digital signals that are outputted by the A/D converter 32 for signal processing and print on the plotter 34. Also, computer 33 is able to monitor operation of the etch chamber 22 through control line 35 which drives the RF frequency power supply source 25. This line 35 allows automatical switch-off of the etch-chamber at etch end-point detection, when the desired final trench depth (Df) has been attained.

Note that only one spectrometer could be used as well, should multiplexer means be provided, to process sequentially the information that would be supplied alternately by optic fiber probes 29A and 29B. In addition, use of optic fiber probes 29A and 29B could be no longer required, should the apertures of spectrometers 30A and 30B be directly applied against quartz windows 26A and 26B respectively.

Figure 4:
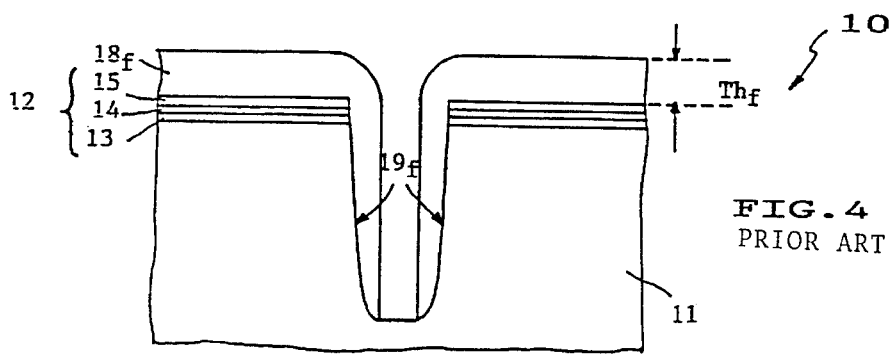

Spectrometers and interferometers have well defined usage in the monitoring of plasma or dry etching equipment. Usually, the spectrometer aperture faces the glow discharge produced by the plasma while the wafer is placed horizontally and at some distance thereof. No interference fringes can be produced in these conditions. The spectrometer detects only a change in light intensity of the selected band. Spectrometer 30A is therefore mounted in accordance with known mounting procedures and generates an output signal Il whose amplitude continuously decreases as the trench depth increases. Still usually, the spectrometer is placed so as to view the interior of the etch treatment chamber 22, through the top view window, at a normal angle of incidence with respect to the wafer plane. Normality is required, because the plasma inside the etch-treatment chamber 22 produces a glow discharge, i.e. a light source where a large number of short wavelengths are available. Under certain circumstances some bands (lines) can produce interferences. In patent application EP-A-394597, assigned to the same assignee as of the present invention, there is described a monitoring apparatus including a standard spectrometer operating in an interferometric mode. As illustrated in FIG. 4 of the cited application, the current signal outputted by the spectrometer is quite sine- shaped. This patent application is incorporated herein by reference.

According to the present invention, optical fiber 29B is also mounted perpendicularly with respect to the wafer to permit viewing of the interior of the etch-treatment chamber 22 at a normal angle of incidence relative to the wafer plane through the top quartz window 26B. The glow discharge produced by the plasma is thus observed by an optical spectrometer which is then used as an interferometer as taught in the above patent application. Consequently, there is obtained an interferometric-like effect that produces an alternating current of gradually decreasing amplitude with maxima and minima values of the top signal It produced by the top spectrometer 30B. The periodicity of the top signal It comes from the interferences produced by the redeposited $SiO_2$ layer growth during the trench formation process.

It is important to have the monochromators of both spectrometers 29A and 29B set to detect at the same radiation, i.e. the same band wavelength of a determined species. A few considerations are now given about band wavelength selection. During the trench formation process, the glow discharge spectrum shows many silicon bromine (SiBr) bands over a wide range. As a result, silicon bromine was the selected species and bands 407 nm, 614 nm, and 828 nm were more particularly studied to determine the most useful among them to carry out the present invention. Even if the band intensity is different, the behavior is the same, because all these bands are appropriate to make interferences. The following table indicates for these SiBr band wavelengths, their relative intensity and amplitude variation, as far as the top signal It is concerned.

TABLE

| Wavelength (nm) | Relative intensity (arbitrary units) | Amplitude variation (%) |
| --- | --- | --- |
| 828 | 100 | 6 |
| 614 | 20 | 10 |
| 407 | 15 | 20 |

Figure 1:
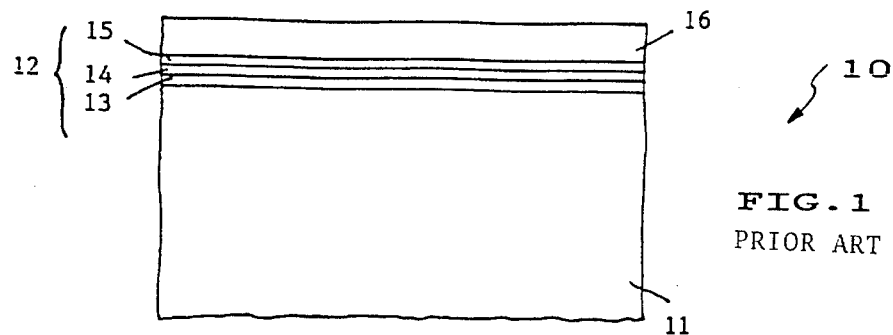
FIGS. 1 to 5 are partial cross-sectional views of a semiconductor substrate that schematically illustrate a conventional trench formation process.
Figure 2:
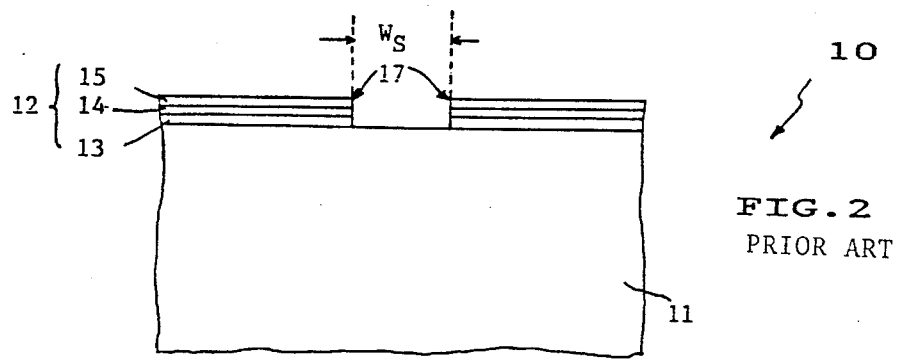

To obtain more periods of the top signal It during the etching duration (from the structure of FIG. 2 to the structure of FIG. 4), with the maximum amplitude variation, the shortest band wavelength, i.e. 407 nm, was selected as suggested by the above table, because this band has the maximum variation in percent. By using appropriate optic fibers, it should even be possible to select a shortest band wavelength of SiBr or even another species, to obtain a higher number of periods for still more accurate interferometric measurements.

According to the present invention, the method of monitoring the trench formation process in a semiconductor substrate comprises the basic following steps in real time:
1. generating top and side output signals, respectively It and Il, from top and side spectrometers as a function of the etching duration or time t;
2. subtracting side signal Il from top signal It to generate the interferometric component signal Ii;
3. elaborating the envelope signals Ja and Jb of signal Ii and signal I corresponding to the amplitude variation thereof;
4. computing trench depth D using the said amplitude variation signal I; and,
5. computing the thickness Th of the growing redeposited $SiO_2$ layer from the said interferometric signal Ii as soon as the first half-period thereof is available.

The foregoing steps are continuously repeated whereby the trench formation process is continuously monitored.

Figure 3:
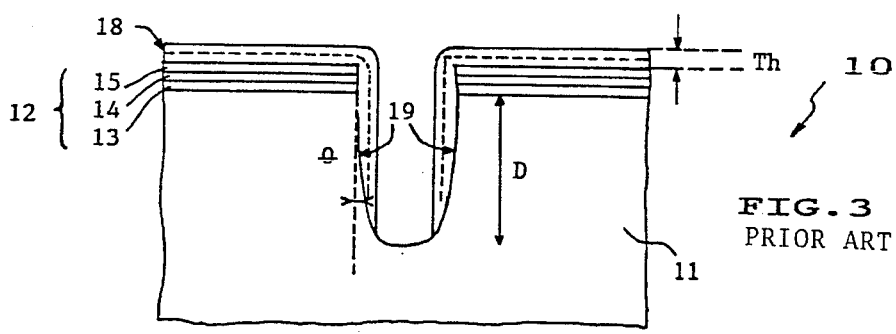

During the etching duration, Il and It signals outputted, respectively, from side and top spectrometers 30A and 30B are of a different nature and contain useful and distinct information:

signal Il is the current collected from the side spectrometer 30A and is representative of the band intensity variation during the formation of the trench. Signal Il given in intensity (%) arbitrary units versus the etching duration or time t (in seconds) is illustrated by curve 36 in FIG. 7. As apparent from FIG. 7, from the side window 26A we obtain a current where the intensity is continuously decreasing but not linearly. Signal Il decreases rapidly at the beginning of the trench formation process and more slowly at the end. Curve 36 could have provided direct information on trench depth, had it been a straight decreasing line. No interference effect modulates this signal. Signal Il is related in some respect to the trench depth D. When etching is stopped at time tf, the intensity that can then be measured is therefore related to Dr.

signal It is the current collected from the top spectrometer 30B and appears to be representative of both the band intensity variation (as does signal Il) and the reflectivity of the wafer. The latter corresponds to the reflectivity of mask 12 at the very beginning of the etching process when the structure is at the stage of FIG. 2, and to the reflectivity of layer 18 during the trench formation process (see FIG. 3 structure). The intensity variation of signal It during etching is illustrated by curve 37 in FIG. 8, for the same intensity (%) arbitrary units. Thus, signal It supplied by spectrometer 30B is a mixed signal with band intensity and interferometric components, because it is a function of both the etching of silicon in the trench and the reflectivity of the growing redeposited $SiO_2$ layer 18. Assuming that both signal components intervene linearly, one can write It=Il+Ii, where Ii is referred to as the interferometric component of signal It. As a result, signal Ii can be simply extracted by substracting Il from It. Signal Ii is therefore related in some respect to the thickness Th of the redeposited $SiO_2$ layer 18 at time t, because it essentially depends on the wafer reflectivity. When etching is stopped at time tf, the current signal that can then be measured is therefore related to Thf.

Figure 5:
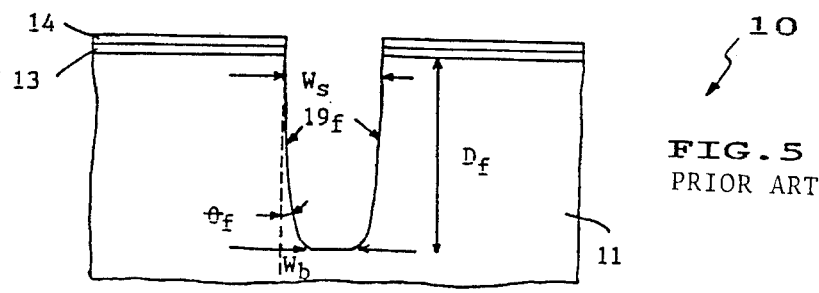
Figure 7:
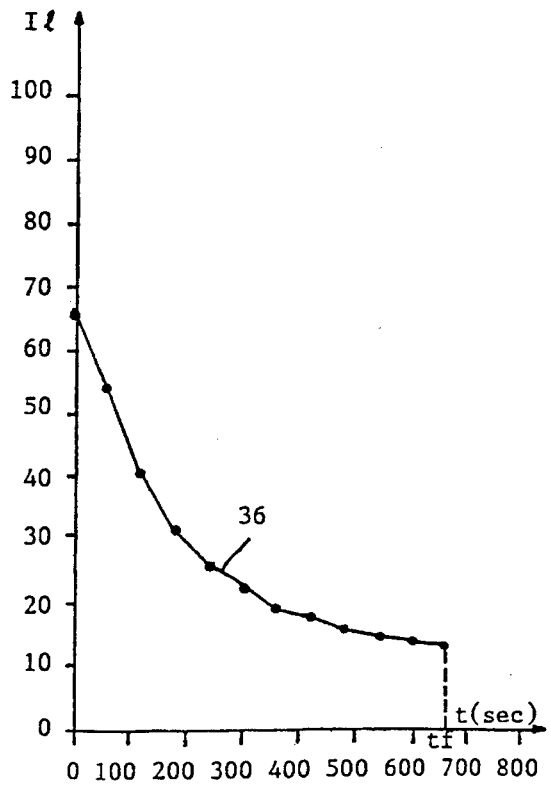
FIGS. 7 and 8 are intensity-time curves that illustrate respectively the side and top signals generated by the side and top spectrometers depicted in FIG. 6.
Figure 8:
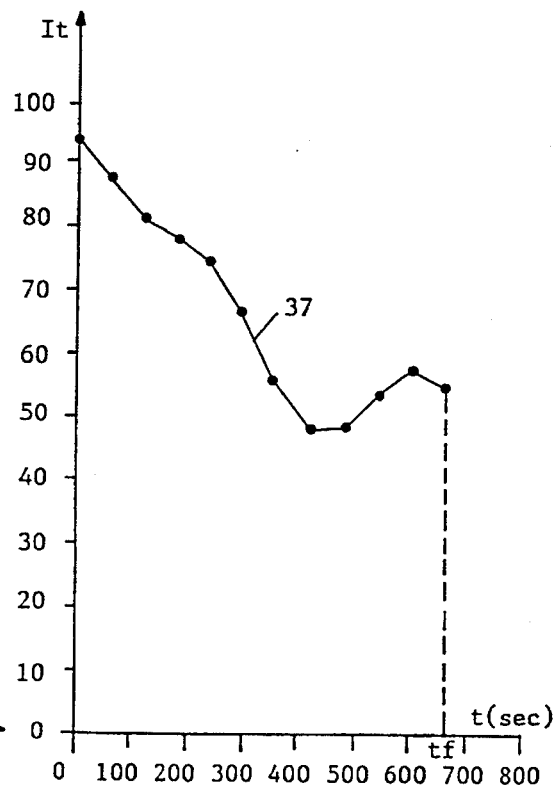
Figure 9:
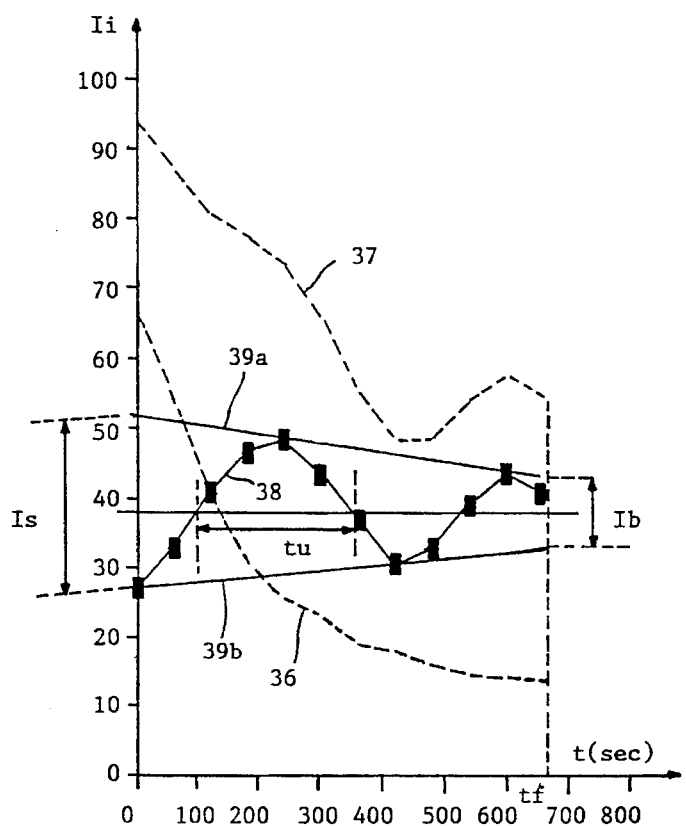
FIG. 9 is an intensity-time curve that illustrates (a) the signal of the quasi-periodic-damped type that is obtained by subtracting said side and top signals and (b) the envelope signals of said quasi-periodic damped type signal.

Now turning to FIG. 9, where curves 36 and 37 of FIGS. 7 and 8 respectively, have been reported, the variation of the interferometric component Ii of signal It as a function of the etching duration t is illustrated by curve 38. These curves are those that can be printed on plotter 34. As apparent from FIG. 9, signal Ii is of the quasi-periodic damped sine-shaped type. Envelopes of curve 38, referenced 39A and 39B, are also represented in FIG. 9, and corresponds to the so-called envelope signals Ja and Jb of the interferometric signal Ii in real time. Envelope signals Ja and Jb define the boundaries (i.e., the maximum and minimum) of curve 38. Signal I is defined as the amplitude variation of the two envelope signals Ja and Jb. When the process starts at t=0, we have I=Is and when the process ends at t=tf, we have I=Ib. Applicant's inventor has discovered that unexpectedly there is an accurate correlation between the variation in real time of signal I and the trench depth. As a matter of fact, said envelope amplitude variations Is and Ib, of the interferometric signal Ii shown in FIG. 9, are respectively representative of the trench widths Ws (at the surface when t=0) and Wb (at the bottom at time t=tf) as defined in the structure of FIG. 5, for all the trenches that are seen by the top optical fiber probe. The thickness Th computation in real time requires the half-period of signal Ii.

All basic signal processing operations including the signal subtraction Ii=(It−Il) in real time mentioned above, can be effected manually by an operator or preferably, automatically by the software operated computer 33. The software is written using programming methods known to those of ordinary skill in the art so as to separate the mixed information and isolate the interferometric component signal Ii for further processing. Such isolation of signal Ii permits the extraction of useful information, e.g., information used in the generation of the envelope signals Ja and Jb and the amplitude variation signal I thereof, as well as to proceed to the different formula computation, as it will be detailed hereafter with respect to the completion of the trench formation process. Assuming we are in an automatic process, the software is able to calculate in real time the depth D expressed by the square root of the intensity difference between Is and I, i.e. $D = k\sqrt{Is-I}$, wherein Is is the amplitude variation of signal I at time t=0 when process starts. Coefficient k is proper to the characteristics of the etching system 20 and is determined by a preliminary calibration step through SEM cross section analysis.

Simultaneously, the software also calculates in real time the quasi half-period tu of the interferometric signal Ii as soon it becomes available (about after 400 sec, see FIG. 9), and then monitors the thickness Th of the redeposited $SiO_2$ layer as a function of time t by the following equation:

$$Th = \left(\frac{\lambda}{4ntu}\right) t$$

wherein
λ=Wavelength of the selected band (e.g. 407 nm SiBr)
n=Refractive index of $SiO_2$ layer 18 (n=1.46)
tu=Half-period of signal Ii
t=Etch time When D=Df (the desired trench depth) at time t=tf, the etch process is stopped. Therefore, tf is the run duration, i.e. time to reach etch end-point or the total etch time.

The results that are obtained with the method and apparatus of the present invention can be compared with those obtained with the conventional ellipsometry and SEM cross-section analysis techniques.

Figure 10:
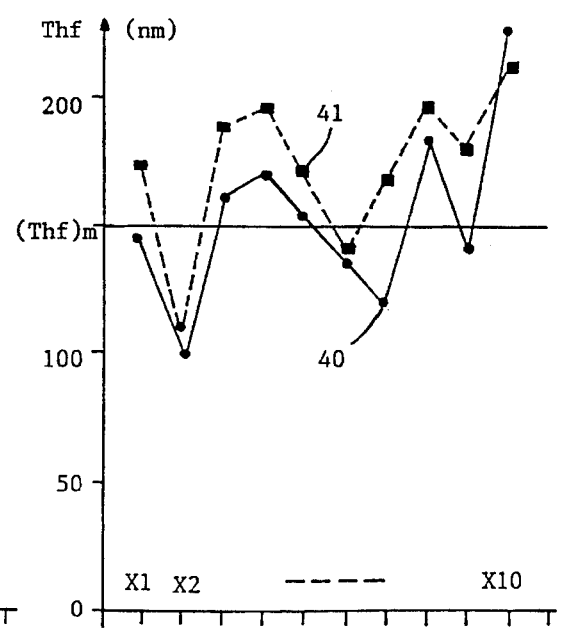
FIG. 10 illustrates the excellent correlation between measurements of the final thickness of the redeposited pyrolitic $SiO_2$ layer effected by the method of the present invention and by standard ellipsometry, for ten wafers sampled in different lots.

Now turning to FIG. 10, the final thickness Thf of sample wafers selected in ten different lots, referenced X1 to X10, were measured according to the method of the present invention, and then through the standard ellipsometry technique. Values are around the nominal final thickness (Thf)m of about 150 nm, given by the specifications. Curves 40 and 41 respectively join the values found with the monitoring method of the present invention and by ellipsometry. FIG. 10 demonstrates the excellent correlation between the results obtained by the two methods in that respect.

Figure 11:
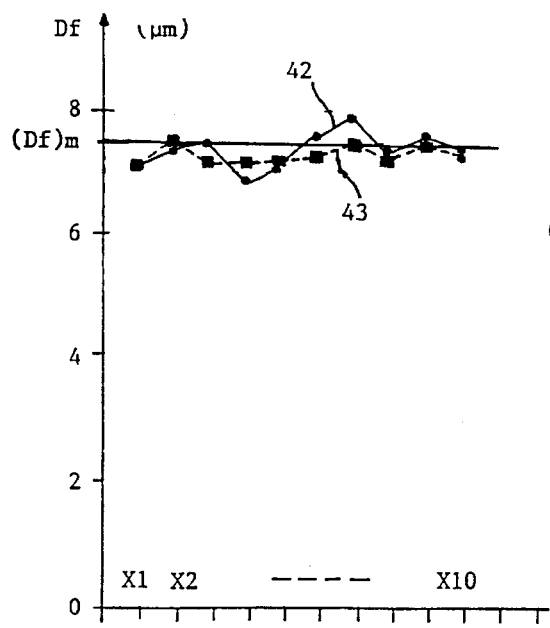
FIG. 11 illustrates the excellent correlation between measurements of the final depth of the trench effected by the method of the present invention and by SEM cross-section analysis, for the same ten wafers.

FIG. 11 shows similar measurements with respect to Df, around a nominal trench depth value of (Df)m=7.5 microns given by the specifications for the same wafers X1 to X10. The final depths of the trenches were first measured according to the method of the present invention, then through destructive SEM cross-section analysis. Curves 42 and 43 respectively join the values found with the method of the present invention and by the SEM cross-sections analysis. There is still an excellent correlation between the results obtained by the two methods in that respect.

Finally, the comparison between the theoretical curves and the measured data is quite satisfactory.

EXAMPLE

FIG. 9 shows the results that were obtained in one practical experimentation. For the etching system 20 in question, the coefficient k was found equal to about 2.2. Coefficient k is generally determined on a monthly basis, or after occurrence of a significant change in the process parameters, by a calibration step on a sample wafer using the monitoring method of the present invention and comparing with a SEM cross-section analysis.

The amplitude variation I was continuously monitored through $I = Is - (D/k)^2$ with Is=22 arb. units.

The desired final trench depth Df is 7.5 μm, so that the final amplitude variation I=Ib is given by:

$Ib = 22 - (7.5/2.2)^2 = 22 - 11.6$ i.e. about 10 arb. units

When this value was attained, the etch process was stopped.

This value Ib determines the total etch time tf, which may be numerically determined from FIG. 9, i.e. tf=660 s (11 min.).

Simultaneously, the thickness of the redeposited $SiO_2$ layer 18 was also monitored. The half-period tu is given by FIG. 9, tu=250 s. At the end of the etching, the final thickness Thf was determined by:

$$Thf = \left(\frac{\lambda}{4ntu}\right) \cdot tf = \frac{407 10^{-9} \times 660}{4 \times 1.46 \times 250} = 184 \text{ nm}$$

By comparison, the nominal expected value for Thf is 150 nm. Experiments have shown that a Thf value between 100 nm and 200 nm is acceptable. Outside this range, it is recommended to adapt the gas flow ratios to correct the thickness Thf.

Continuous monitoring of Th is important, because if the etching process is going too fast, the redeposited $SiO_2$ layer 18 (see FIG. 3) grows with an insufficient rate. As a result, the taper angle may be equal to zero (vertical trench sidewalls) or even become negative (the top of the trench exhibits a significant overhang). On the contrary, if the etching process is too slow, the redeposited $SiO_2$ layer grows at a higher rate than desired, and the taper angle will be too important and will not meet the specifications. In both cases, as mentioned above, the gas flow ratios are modified to correct the trench formation process for the next wafer to be processed.

In summary, the interferometric signal Ii allows computation of the thickness of the $SiO_2$ layer that is redeposited during the trench formation process. The half-period tu is computed as soon as it is available. The selected wavelength and the refractive index of layer 18 are stored in the computer 33. Thickness Th is therefore easy to calculate in real time. Computation in real time of the trench depth D is also easy once the amplitude variation of envelope signals Ja and Jb of interferometric signal Ii is determined. The initial amplitude variation Is is determined when the process starts and is then stored in the computer.

The numerical example given above broadly corresponds to wafer referenced X8 in FIGS. 10 and 11.

To conclude, the monitoring method of the present invention when combined with a plasma or dry etching trench formation process safely provides deep trenches that can be reproducibly etched with excellent control of geometries. In particular, it provides trenches having controllable and reproducible characteristics: accurate depth Df and final taper angle θf because θf can be relatively well monitored through the monitoring of parameters Df and Thf.

As a result, DRAM cells having reliable capacitors formed in trenches of about 7.5 microns (or more) depth can be manufactured according the present method of monitoring. In addition, the present method saves time and product wafers at the cost of minimal or even no modification either on the etching equipment or on the optical spectrometers. All hardware parts shown in FIG. 6 can be easily acquired on the market. An easy to design software combined with a personal computer allows (a) on-line and in-situ data acquisition, either simultaneously or sequentially (in case only one spectrometer is used), (b) the digital processing of the analog signals supplied by the two spectrometers and, finally, (c) real time calculation of the key parameters of the trench formation process by dry etching for accurate monitoring thereof.

What is claimed is:

1. A system for monitoring the formation of a trench in a semiconductor wafer using a dry etching apparatus having (a) an etch-treatment chamber in which the semiconductor wafer to be processed is received, (b) trench formation means for forming a trench in a wafer positioned in the etch-treatment chamber and for redepositing a layer of $SiO_2$ on the surface of the wafer, the trench formation means including a plasma source for generating a plasma that is directed to etch away the wafer so as to form the trench, with a glow discharge being created as a consequence of the plasma etching of the wafer, and (c) first and second windows for use in viewing the plasma in the etch-treatment chamber, the first window being positioned to permit viewing of the plasma from a plane extending parallel to the surface of the wafer and the second window being positioned to permit viewing of the plasma from a plane extending normal to the surface of the wafer, the monitoring system comprising:

spectrometer means coupled with said first and second windows for providing first and second output signals, said first output signal containing information that varies with time based on changes in intensity of a selected wavelength of radiation in the glow discharge and said second output signal containing information that varies with time based on (1) changes in intensity of said selected wavelength of radiation and (2) changes in reflectivity of the redeposited $SiO_2$ layer; and processing and decision means., coupled with said spectrometer means so as to receive said first and second output signals, for determining the depth of the trench and the thickness of the redeposited $SiO_2$ layer based on said information contained in said first and second output signals.

2. A system according to claim 1, wherein said processing and decision means further includes determination means for determining and indicating when the trench has been etched to a selected depth.

3. A system according to claim 2, wherein said processing and decision means further includes means coupled with said trench formation means and said determination means for automatically terminating formation of the trench when the trench has been etched to said selected depth.

4. A system according to claim 1, wherein said spectrometer means comprises a first spectrometer associated with said first window for providing said first output signal and a second spectrometer associated with said second window for providing said second output signal.

5. A system according to claim 4, wherein said spectrometer means further includes:

a first optical fiber probe connected between said first window and said first spectrometer; and a second optical fiber probe connected between said second window and said second spectrometer.

6. A system according to claim 1, wherein said selected wavelength of radiation detected by said spectrometer means is equal to the wavelength of radiation associated with a selected specie of silicon bromide (SiBr) present in the plasma.

7. A system according to claim 6, wherein said selected specie of SiBr radiation has a wavelength of 407 nm.

8. A method of monitoring a trench formation process in a silicon wafer performed using dry etching equipment including (a) a plasma source for generating a plasma that forms a trench in the wafer, the plasma having a glow discharge associated therewith, and (b) redeposition means for redepositing a layer of $SiO_2$ on the wafer during formation of the trench, the method comprising the steps of:

monitoring changes in the intensity of a selected specie of radiation in the glow discharge from a first location relative to the wafer and generating a first signal containing information that varies with time as a function of such changes in intensity;

monitoring, from a second location relative to the wafer, (a) changes in reflectivity of the layer of redeposited $SiO_2$ and (b) changes in intensity of said selected specie of radiation, and generating a second signal containing information that varies with time as a function of such changes in intensity and reflectivity; and determining in real time the depth D of the trench and the thickness Th of the redeposited layer of $SiO_2$ based on said information in said first and second signals.

9. A method according to claim 8, wherein said determining step comprises the steps of:

generating a sinusoidally varying third signal containing information that varies with time as a function of said changes in reflectivity of the layer of redeposited $SiO_2$, said third signal being generated based on information in said second signal;

computing the quasi half-period tu of said third signal as soon as it is available;

generating envelope signals Ja and Jb defining the maxima and minima of said sinusoidally varying third signal;

generating a fourth signal representing the difference in amplitude of said envelope signals Ja and Jb;

calculating the trench depth D using the formula:

$$D = k\sqrt{I(t=0) - I} \quad ,$$

wherein k is a coefficient that varies based on the etching system being used and is determined in a preliminary calibration step; and calculating the thickness Th of the layer of redeposited $SiO_2$ using the formula:

$$Th = \left( \frac{\lambda}{4(n)tu} \right) \cdot t$$

wherein,

λ=Wavelength of said selected specie of radiation n=Refractive index of the layer of redeposited $SiO_2$ tu=Half-period of said third signal t=Etch time.

10. A method according to claim 8, further comprising the step of terminating the trench-formation process when said depth D reaches a predetermined level.

11. A method according to claim 8, further comprising the step of adjusting the operation of the dry etching equipment when the value of said thickness Th falls outside of a predetermined range so as to cause the value of said thickness Th to return to said predetermined range.

12. A method of fabricating a semiconductor device having a trench structure, the method including the steps of:

supporting a semiconductor wafer in an etch-treatment chamber provided with side and top windows and connected to a power supply source for generating a plasma within said chamber that etches said trench, said plasma having a glow discharge associated therewith;

etching a trench into a silicon wafer and redepositing a layer of SiO$_2$ on said wafer;

generating a first signal Il as a function of time t representative of the intensity of the radiation of a selected specie in the plasma by viewing the plasma in a plane parallel to the plane of the wafer and at close proximity thereto;

generating a second signal It as a function of time t representative of (a) said intensity of the radiation of said selected specie and (b) the reflectivity of the surface of the wafer, as viewed through said plasma along a plane extending perpendicular to the surface of the wafer;

subtracting said first signal Il from said second signal It to generate a sinusoidally varying difference signal Ii representing an interferometric component of said second signal It;

generating envelope signals Ja and Jb representing the maxima and minima of said difference signal Ii and determining a signal I representative of the difference in amplitude of said envelope signals Ja and Jb;

continuously monitoring in real time (a) the trench depth D using the formula:

$$D = k \sqrt{I(t=0) - I(t)} \quad ,$$

wherein k is a coefficient that depends on the etching system that is used and is determined by a preliminary calibration step and (b) the thickness Th of said redeposited SiO$_2$ layer using the formula:

$$Th = \left( \frac{\lambda}{4ntu} \right) \cdot t$$

wherein, $\lambda$=Wavelength of the radiation of the selected specie n=Refractive index of said redeposited SiO$_2$ layer tu=Half-period of signal Ii t=Etch time and, terminating said etching and redeposition steps when said trench depth D and said SiO$_2$ layer thickness Th reach predetermined values.

13. A system for forming a trench in a semiconductor wafer having a surface, the system comprising:

a dry etching apparatus having (a) an etch-treatment chamber in which the semiconductor wafer to be processed is received and (b) trench formation means for forming a trench in a wafer positioned in said etch-treatment chamber and for redepositing a layer of dielectric on the surface of the wafer during the formation of the trench, said trench formation means including a plasma source for generating a plasma that etches the wafer so as to form the trench, with a glow discharge being created as a consequence of the plasma etching of the wafer;

spectrometer means, coupled with said etch-treatment chamber so as to detect the intensity of the glow discharge from first and second locations and so as to detect the reflectivity of the redeposited layer of dielectric at said second location, (1) for providing a first output signal containing information that varies with time based on changes in intensity of a selected wavelength of radiation in the glow discharge, as detected at said first location, and (2) for providing a second output signal containing information that varies with time based on (a) changes in intensity of said selected wavelength of radiation and (b) changes in reflectivity of the redeposited dielectric layer, as detected at said second location; and processing and decision means, coupled with said spectrometer means so as to receive said first and second output signals, for determining the depth of the trench and the thickness of the redeposited dielectric layer based on said information contained in said first and second output signals.

14. A system according to claim 13, said etch-treatment chamber having a first window at said first location positioned to permit viewing of the plasma from a plane extending parallel to the surface of the wafer and a second window at said second location positioned to permit viewing of the plasma from a plane extending normal to the surface of the wafer.

15. A system according to claim 13, further comprising control means, coupled with said processing and decision means and said dry-etching apparatus, (1) for terminating operation of said dry-etching apparatus when said processing and decision means has determined that the depth of the trench has reached a predetermined level and (2) for adjusting operation of said trench formation means when said processing and decision means determines that said redeposited layer of dielectric is being deposited faster or slower than a predetermined rate of deposition so as to cause said redeposited layer of dielectric to be deposited at said predetermined rate.

* * * * *